(12) United States Patent
Breuning

(10) Patent No.: US 10,026,528 B2
(45) Date of Patent: Jul. 17, 2018

(54) ELECTRIC CONTACT ARRANGEMENT

(71) Applicant: Robert Bosch GmbH, Stuttgart (DE)

(72) Inventor: Christian Breuning, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/575,080

(22) PCT Filed: Apr. 8, 2016

(86) PCT No.: PCT/EP2016/057695
§ 371 (c)(1),
(2) Date: Nov. 17, 2017

(87) PCT Pub. No.: WO2016/184606
PCT Pub. Date: Nov. 24, 2016

(65) Prior Publication Data
US 2018/0151274 A1 May 31, 2018

(30) Foreign Application Priority Data

May 21, 2015 (DE) .................. 10 2015 209 279

(51) Int. Cl.
*H02B 1/01* (2006.01)
*H01B 17/30* (2006.01)
(Continued)

(52) U.S. Cl.
CPC ......... *H01B 17/301* (2013.01); *H01B 17/303* (2013.01); *H01R 4/34* (2013.01); *H01R 4/305* (2013.01)

(58) Field of Classification Search
CPC ........ H01R 4/34; H01R 4/305; H01B 17/301; H01B 17/303
(Continued)

(56) References Cited

U.S. PATENT DOCUMENTS

| 1,766,869 A | * | 6/1930 | Austin | ................ | H01B 17/301 |
| | | | | | 123/169 PH |
| 2,078,453 A | * | 4/1937 | Miller | .................... | B60R 17/00 |
| | | | | | 248/56 |

(Continued)

FOREIGN PATENT DOCUMENTS

| EP | 1359662 | 11/2003 |
| EP | 2015626 | 1/2009 |

OTHER PUBLICATIONS

International Search Report for Application No. PCT/EP2016/057695 dated Jun. 20, 2016 (English Translation, 2 pages).

*Primary Examiner* — Abdullah Riyami
*Assistant Examiner* — Vladimir Imas
(74) *Attorney, Agent, or Firm* — Michael Best & Friedrich LLP

(57) ABSTRACT

The present invention relates to an electric contact arrangement (1) comprising: a housing (2) having a recess (3) that penetrates the housing (2) in an axial direction (7); a sleeve (4) which is inserted into the recess (3) and which has an axial sealing surface (8) inside the housing (2) and two projections (10) outside the housing (2) which run perpendicularly to the axial direction (7); a contact pin (5) which is fixed in the sleeve (4) and which extends through the sleeve (4); an attachment element (6) which is designed to lie on the housing (2) and to be slid under the projections (10); and wedge shaped surfaces (13) between the sleeve (4) and the attachment element (6) and/or between the housing (2) and the attachment element (6) such that the sealing surface (8) can be drawn against the housing (2) from the inside by means of sliding the attachment element (6) under the projections (10).

13 Claims, 5 Drawing Sheets

(51) Int. Cl.
*H01R 4/34* (2006.01)
*H01R 4/30* (2006.01)

(58) Field of Classification Search
USPC ............ 439/908, 559, 562, 565; 174/153 R, 174/152 R, 151
See application file for complete search history.

(56) References Cited

U.S. PATENT DOCUMENTS

| | | | | |
|---|---|---|---|---|
| 2,264,816 A * | 12/1941 | Treanor | ............... | H01B 17/301 174/152 R |
| RE22,086 E * | 4/1942 | Treanor | ............... | H01B 17/301 174/152 R |
| 2,284,926 A * | 6/1942 | Smith | ................... | H01B 17/303 174/12 BH |
| 2,308,022 A * | 1/1943 | Peterson | .............. | H01B 17/303 174/152 R |
| 2,664,132 A * | 12/1953 | Leverte | ................... | H01R 33/02 411/176 |
| 2,744,185 A * | 5/1956 | Cawley | ..................... | G05G 1/10 200/316 |
| 2,869,094 A * | 1/1959 | Francis | ................ | H01R 13/745 439/550 |
| 3,074,149 A * | 1/1963 | Rademaker | .......... | H01B 17/306 174/151 |
| 3,790,922 A * | 2/1974 | Normann | ............... | H01R 13/74 285/321 |
| 3,850,501 A * | 11/1974 | Butterfield | ............. | H01B 17/58 439/196 |
| 4,407,042 A * | 10/1983 | Schramme | ............. | H02B 1/044 16/2.1 |
| 4,624,429 A * | 11/1986 | Miyazaki | ............... | F16L 3/1222 248/27.1 |
| 4,640,478 A * | 2/1987 | Leigh-Monstevens | . | B60T 11/16 248/27.1 |
| 4,687,446 A * | 8/1987 | Birch | ................... | H01R 24/547 439/553 |
| 4,743,210 A * | 5/1988 | Schild | ................... | H01B 17/308 439/559 |
| 4,791,247 A * | 12/1988 | Cacalloro | .............. | H01B 17/22 156/245 |
| 5,066,247 A * | 11/1991 | Watson | ................ | H01R 13/745 248/27.1 |
| 5,941,730 A * | 8/1999 | Uchiyama | ................ | F02M 37/10 439/550 |
| 5,967,837 A * | 10/1999 | Wolfe | ..................... | H01C 1/01 439/550 |
| 6,394,814 B2 * | 5/2002 | Schmid | ................ | H01R 13/745 439/550 |
| 6,402,330 B1 * | 6/2002 | Scheidegg | ............ | B60R 1/0605 359/871 |
| 6,560,819 B2 * | 5/2003 | Mizuno | ............... | B60R 16/0222 16/2.1 |
| 6,626,699 B1 * | 9/2003 | Epe | ...................... | H01R 13/625 439/311 |
| 6,634,252 B2 * | 10/2003 | Mayville | ................. | F16C 1/105 74/500.5 |
| 6,685,493 B2 * | 2/2004 | Birkenmaier | ........ | H01R 13/625 439/314 |
| 7,422,181 B2 * | 9/2008 | Sußenbach | ............... | F16L 3/10 174/664 |
| 7,568,942 B1 * | 8/2009 | Lannon | .............. | H01R 13/5213 439/136 |
| 7,850,485 B2 * | 12/2010 | Bartholoma | ......... | H01R 13/748 439/550 |
| 7,914,300 B2 * | 3/2011 | Akahori | ............... | B60R 16/0238 439/76.2 |
| 7,988,394 B2 * | 8/2011 | Babej | .................... | F16B 37/062 411/181 |
| 8,267,708 B1 * | 9/2012 | Sochor | ................. | A61N 1/3754 439/289 |
| 8,287,308 B2 * | 10/2012 | Yang | .................... | H01Q 1/1242 343/906 |
| 8,435,040 B2 * | 5/2013 | Costabel | ............. | B60R 13/0206 439/34 |
| 8,590,749 B2 * | 11/2013 | Beranger | ............ | B05B 11/3049 222/153.09 |
| 8,608,518 B2 * | 12/2013 | Wu | ........................ | H01R 4/302 439/812 |
| 8,662,808 B2 * | 3/2014 | Chen | ....................... | H01R 4/34 411/324 |
| 9,070,989 B2 * | 6/2015 | Yasui | ....................... | H01R 4/38 |
| 9,179,581 B2 * | 11/2015 | Suwa | ................. | H05K 7/20927 |
| 9,318,817 B2 * | 4/2016 | Hildebrand | ............. | H01R 4/34 |
| 9,318,819 B2 * | 4/2016 | Backstrom | ............ | H01R 4/56 |
| 9,584,061 B1 * | 2/2017 | Dede | .................... | H02M 1/32 |
| 9,899,777 B2 * | 2/2018 | Wendt | ................ | H01R 13/6273 |
| 9,917,378 B2 * | 3/2018 | Yamada | ................... | H01R 4/50 |
| 2007/0091547 A1* | 4/2007 | Murakami | ........... | H01H 85/044 361/627 |
| 2009/0059637 A1 | 3/2009 | Sato et al. | | |
| 2014/0326498 A1* | 11/2014 | Romano | ............... | H02G 15/013 174/652 |
| 2015/0004852 A1* | 1/2015 | Hildebrand | ............. | H01R 4/34 439/810 |

* cited by examiner

ELECTRIC CONTACT ARRANGEMENT

BACKGROUND OF THE INVENTION

The present invention relates to an electrical contact arrangement. The contact arrangement is used in particular in a motor vehicle.

In the automotive sector, the prior art discloses various housings in which for example control units, power electronics or energy stores are arranged. In order to connect these components in the housing, a connector pin usually projects through the housing. The outer side of the connector pin is connected to the on-board electrical system via a corresponding conductor. The passage of the pin through the housing has at least to be liquid-tight and accordingly electrically insulated.

SUMMARY OF THE INVENTION

The electrical contact arrangement according to the invention shows an arrangement for the contact pin on the housing that is cost-effective to produce and easy to mount. In order to press on the corresponding sealing surfaces, a screwed connection is not required. Fastening takes place merely by introduction of a fastening element. This introduction can also take place on the side of the housing or at inaccessible locations. This is achieved according to the invention by the electrical contact arrangement comprising a housing. Located in the housing is a cutout. The cutout is in particular a circular hole. The contact pin is inserted into the cutout. Thus, the cutout and the contact pin define an axial direction. The contact arrangement according to the invention furthermore comprises a bushing inserted into the cutout. The bushing has an axial sealing surface. The axial sealing surface is located in the interior of the housing. Outside the housing, two ledges extend on the bushing. In particular, the ledges are each formed by grooves. These two ledges are arranged perpendicularly to the axial direction. The contact pin is located in the bushing. As a result, both the contact pin and the bushing project outward from the interior of the housing. The electrical contact arrangement furthermore comprises a fastening element. The fastening element is introduced under the ledges, in particular into the grooves, and in the process rests on the housing. The fastening element is thus located outside the housing and is moved perpendicularly to the axial direction. Formed between the bushing and the fastening element are wedge-shaped surfaces. These wedge-shaped surfaces can also be denoted inclined surfaces. These surfaces are in this case inclined with regard to the axial direction. As a result of the introduction of the fastening element and on account of these wedge-shaped surfaces, the bushing is drawn outward. As a result, the sealing surface is pressed against the housing from the inside and closes it up in a sealed manner. In the preferred variant, the wedge-shaped or inclined surfaces are formed between the bushing and the fastening element. In addition or alternatively, however, it is also possible to arrange these surfaces between the housing and the fastening element. What is crucial is that, as a result of the introduction of the fastening element, the bushing is drawn outward and thus the sealing surface is pressed against the housing from the inside.

The fastening element is advantageously configured in a fork-shaped manner. This means that the fastening element has two parallel fingers. The two fingers are firmly connected together via a base. In particular, the fastening element is a component manufactured in one piece, for example from plastics material. The two parallel fingers are introduced under the two parallel ledges, or into the grooves. As a result of this one-piece fork-shaped fastening element, mounting is very easy since one fastening element is inserted for both grooves. On account of the two parallel grooves, which are located on both sides of the axis, the bushing is drawn uniformly in the axial direction and the sealing surface is pressed uniformly against the housing from the inside.

Particularly preferably, the wedge-shaped surfaces are formed on the fingers of the fastening element and on the ledges. The wedge-shaped or inclined surfaces on the ledges are accordingly located opposite the wedge-shaped or inclined surfaces on the fingers.

Furthermore, provision is preferably made for the contact pin to be arranged in the bushing in a rotation-proof manner by way of a form fit. To this end, the bushing is produced in particular from plastics material. The contact pin is in this case encapsulated by the plastics material of the bushing. For the form fit between the contact pin and bushing, the contact pin is advantageously polygonal. This polygon is encapsulated.

Furthermore, provision is advantageously made for a movement of the contact pin in the axial direction with respect to the bushing also to be avoided on account of a form fit. To this end, the contact pin advantageously has a narrowing. This narrowing is encapsulated by the plastics material of the bushing.

Furthermore, provision is advantageously made for the fastening element to rest on the housing in a rotation-proof manner by way of a form fit. For example, one or two shoulders on the side of the fastening element can ensure this form fit.

That end of the contact pin that projects out of the housing advantageously has a thread. A pole shoe for example is placed on the contact pin. This pole shoe can be fixed via a nut. On account of the rotation-proof arrangement of the contact pin within the bushing and on account of the rotation-proof arrangement of the fastening element, a torque that arises on the housing when the nut is tightened is supported. The sealing between the bushing and housing is thus not loaded by this torque.

Furthermore, provision is preferably made for an inclination of the wedge-shaped surfaces to be selected for a self-locking hold of the fastening element. Depending on the material pairs selected, the necessary angle for the inclination of the wedge-shaped surfaces can be calculated here or determined experimentally. On account of this self-locking action, the fastening element cannot slide out of the grooves by itself. In particular, the angle between the wedge-shaped surfaces and the axial direction is between 95° and 120°.

In addition or as an alternative to the self-locking configuration of the inclination, a latching connection is preferably provided between the fastening element and the housing. In this case, in particular a tongue of the fastening element latches behind a catch secured to the housing. This latching connection serves to fix the introduced fastening element.

A seal is advantageously arranged on the sealing surface of the bushing. This seal is in particular annular. In addition or as an alternative, this seal can also be arranged on the housing. In particular, it is a rubber seal in this case.

The invention furthermore comprises an arrangement for a vehicle. This arrangement has at least one electrical contact arrangement, as has just been described. Arranged in the housing are in this case a control unit, power electronics, an energy store and/or an electric machine. The contact pin is in this case in particular a 12-V or 24-V contact pin for connection to the on-board electrical system of the vehicle.

The claims and advantageous configurations described in the context of the electrical contact arrangement are correspondingly applicable in an advantageous manner to the arrangement according to the invention for the motor vehicle.

BRIEF DESCRIPTION OF THE DRAWINGS

An exemplary embodiment of the invention is described in detail in the following text with reference to the accompanying drawing, in which.

DETAILED DESCRIPTION

An exemplary embodiment of the electrical contact arrangement 1 is described in detail in the following text with reference to FIGS. 1 to 5.

Figure 1:
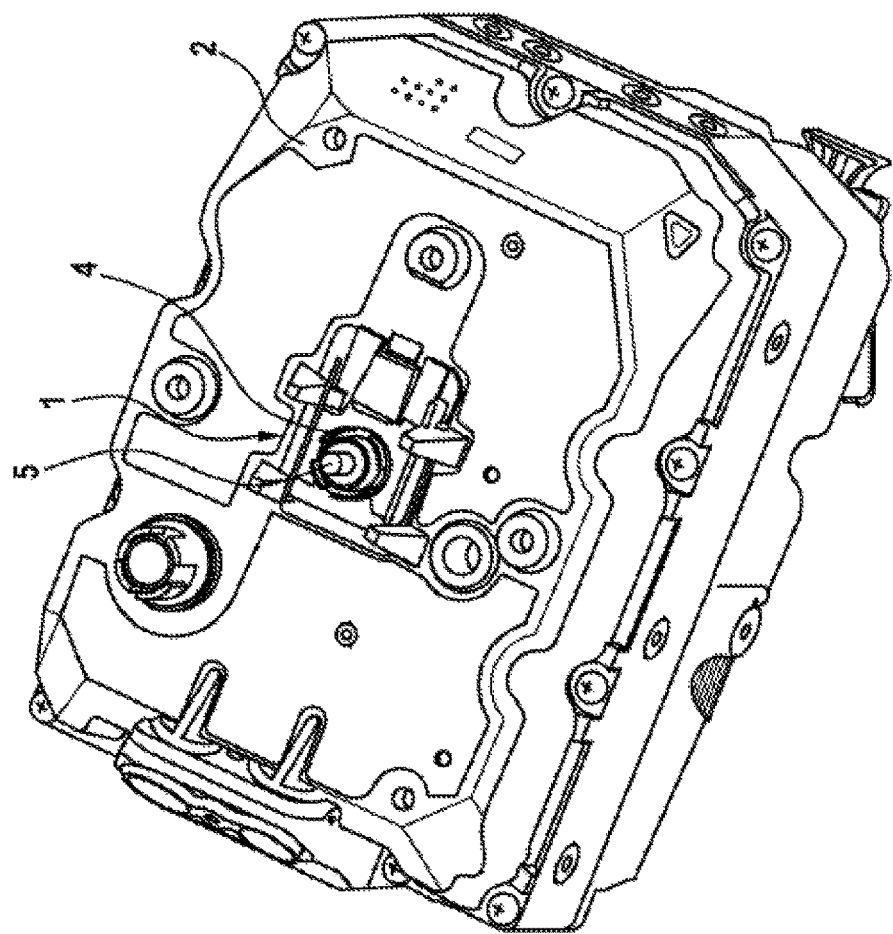
FIG. 1 shows an electrical contact arrangement according to the invention according to one exemplary embodiment.

According to FIG. 1, the contact arrangement 1 comprises a housing 2. Located in the housing 2 are for example power electronics. The housing 2 is installed in particular in a motor vehicle and is exposed to environmental influences, for example water. In the housing, a bushing 4 made of plastics material sits in a cutout 3. A contact pin 5 made of metal has been firmly inserted into this bushing 4. Both the bushing 4 and the contact pin 5 project out of the housing 2. In order to fasten the bushing 4 with respect to the housing 2, use is made of a fastening element 6.

Figure 2:
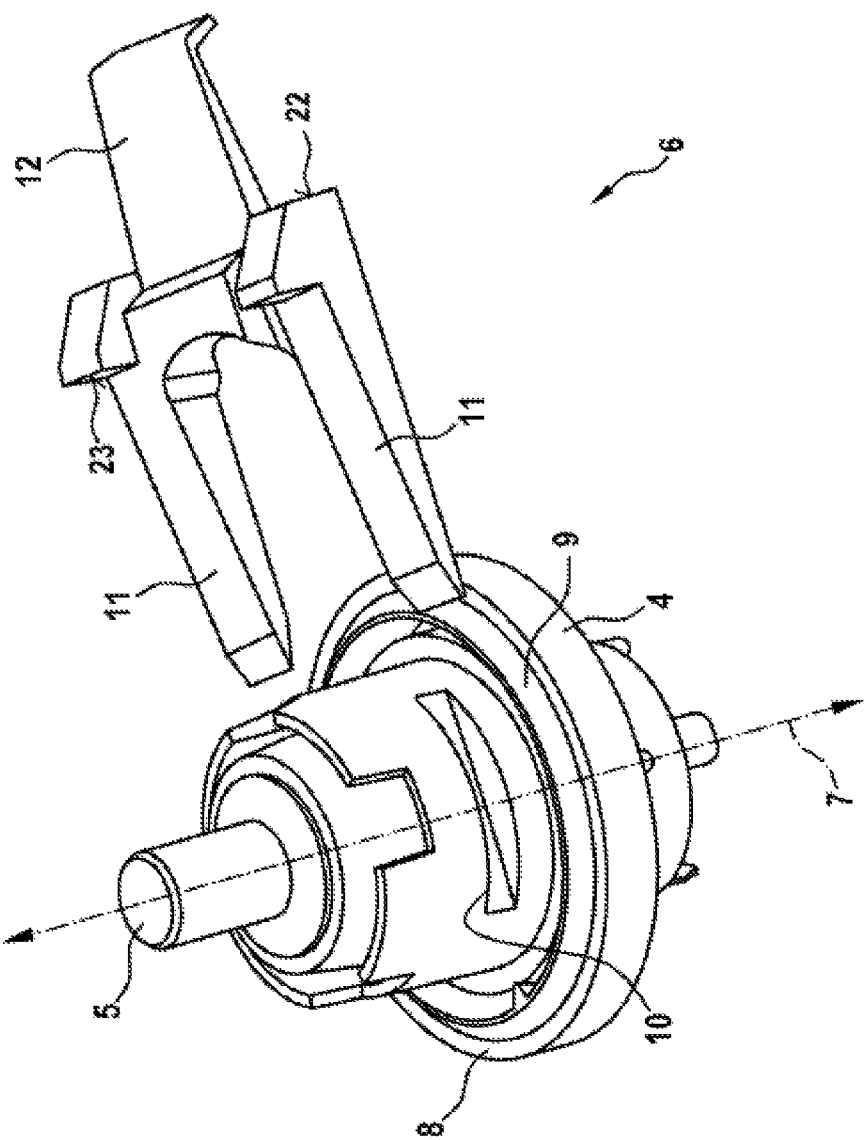
FIGS. 2 and 3 show details of the electrical contact arrangement according to the invention according to the exemplary embodiment.
Figure 3:
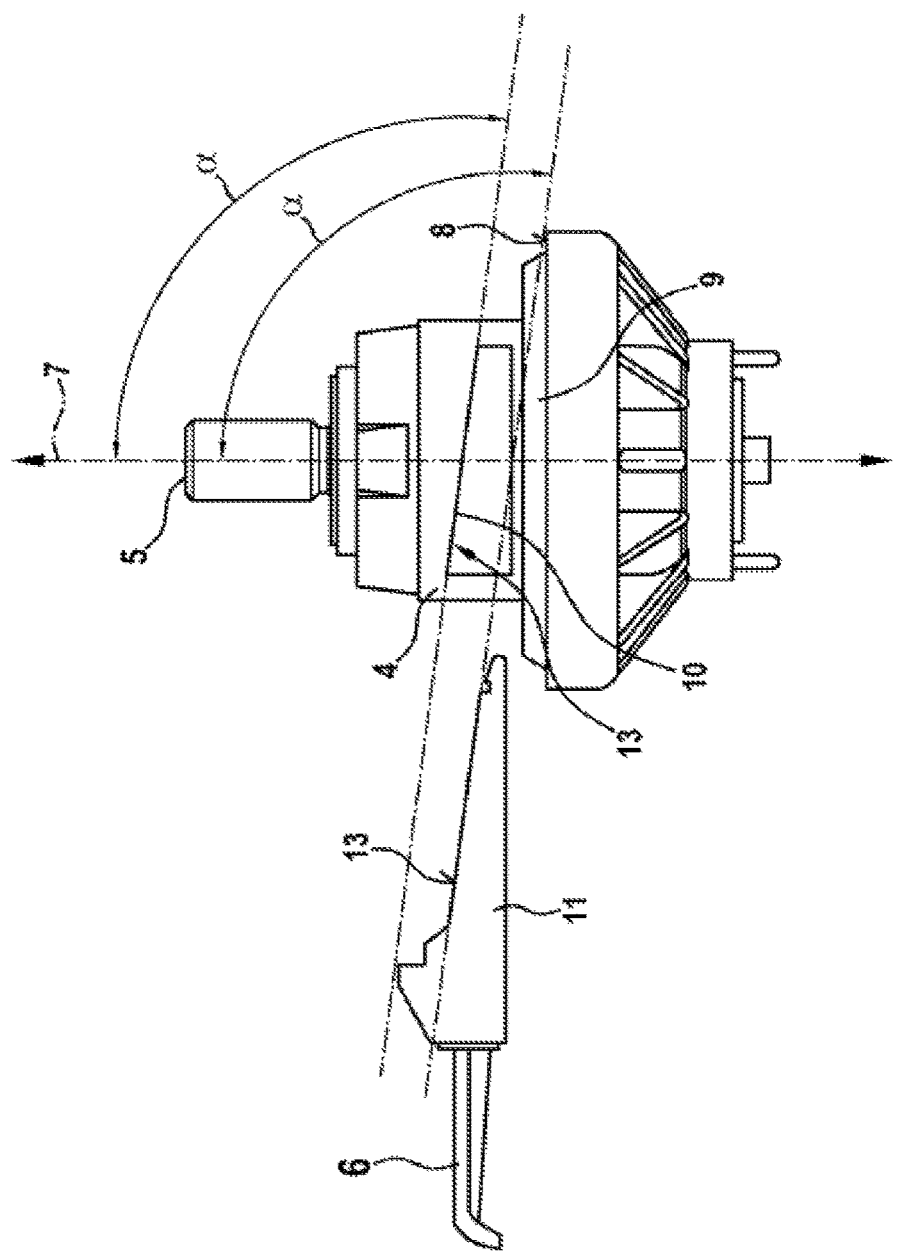

FIGS. 2 and 3 show different views of the use of the bushing 4 and of the fastening element 6 in detail. The extent of the contact pin 5 defines an axial direction 7. Formed on the bushing 4 is an axial sealing surface 8. Seated on this axial sealing surface 8 is an annular seal 9. In order to seal the bushing 4 off with respect to the housing 2, this sealing surface 8 with the seal 9 has to be pressed against the housing 2 from the inside. To this end, the fastening element 6 is used.

Outside the housing 2, the bushing 4 has two ledges 10 in two grooves. The ledges 10 and thus the grooves extend parallel to one another and on both sides of the contact pin 5. The fastening element 6 is configured in a fork-shaped manner. To this end, the fastening element 6 comprises two parallel fingers 11. These two fingers 11 are connected together via a base 12. Provided on the fastening element 6 are two mounting surfaces 22. A tool can act on these mounting surfaces 22 in order to push the fastening element 6 into the grooves. Particularly preferably, dismounting surfaces 23 are provided opposite the mounting surfaces 22, in order optionally to pull the fastening element 6 out of the grooves again.

The two fingers 11 of the fastening element 6 have wedge-shaped surfaces 13. The surfaces 13 can also be referred to as inclined surfaces. Located opposite each wedge-shaped surface 13 of the fingers 11 is a corresponding wedge-shaped surface 13 on the ledge 10 within the respective groove. In particular FIG. 3 shows the inclination of the wedge-shaped surfaces 13 with respect to the axial direction 7. The inclination a is in this case advantageously between 95° and 120°.

As a result of the fastening element 6 being introduced under the ledges 10 and since the fastening element 6 rests on the housing 2, the bushing 4 together with the contact pin 5 is drawn outward in the axial direction 7. As a result, the sealing surface 8 is pressed against the housing 2 from the inside.

Figure 4:
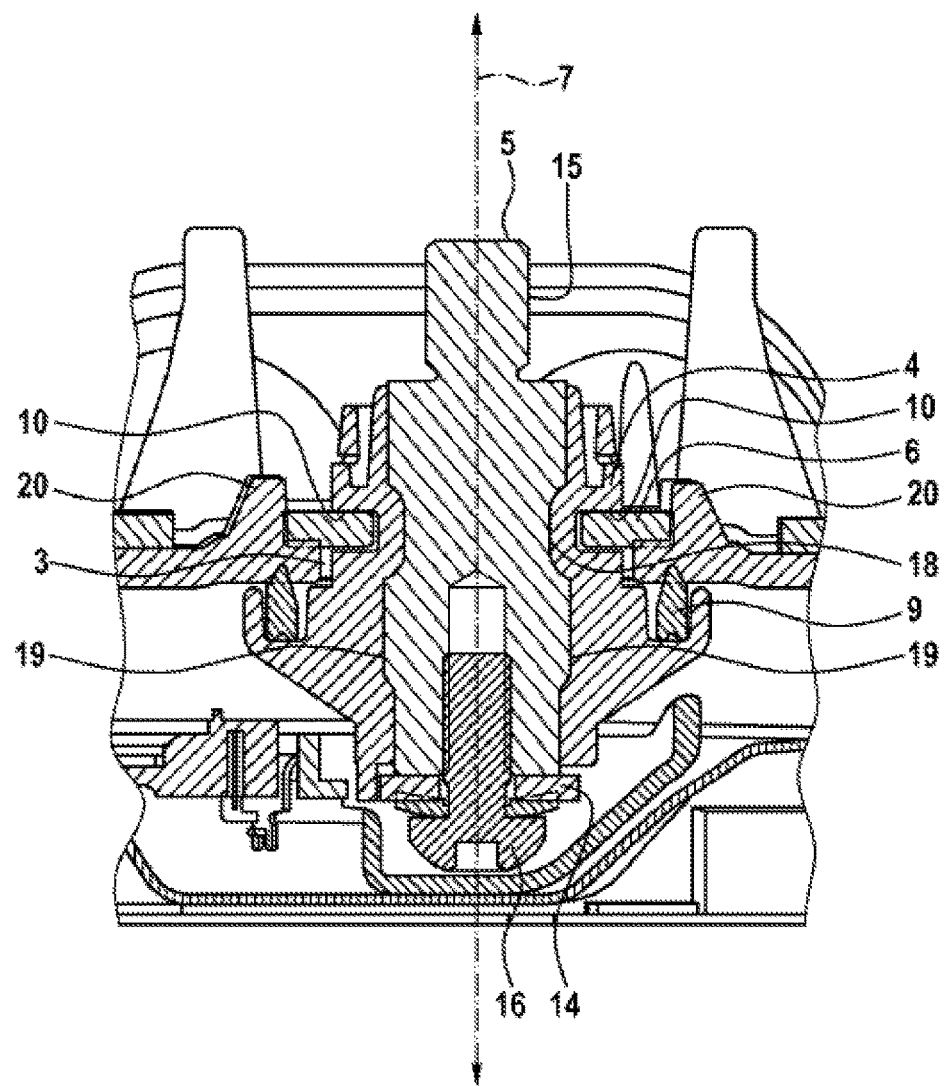
FIG. 4 shows a first sectional view of the electrical contact arrangement according to the invention according to the exemplary embodiment.

FIG. 4 shows a section through the contact arrangement 1. It can be seen from FIG. 4 that the contact pin 5 has a narrowing 18. Formed beneath the narrowing 18 is a polygon 19. Both the narrowing 18 and the polygon 19 are encapsulated by the plastics material of the bushing 4. The narrowing 18 ensures a form fit in the axial direction 7. The polygon 19 prevents rotation about the axial direction 7.

On the inner side, the contact pin 5 is connected to a busbar 14 in an electrically conductive manner. To this end, a corresponding screw connection 16 is set in the axial direction 7.

Figure 5:
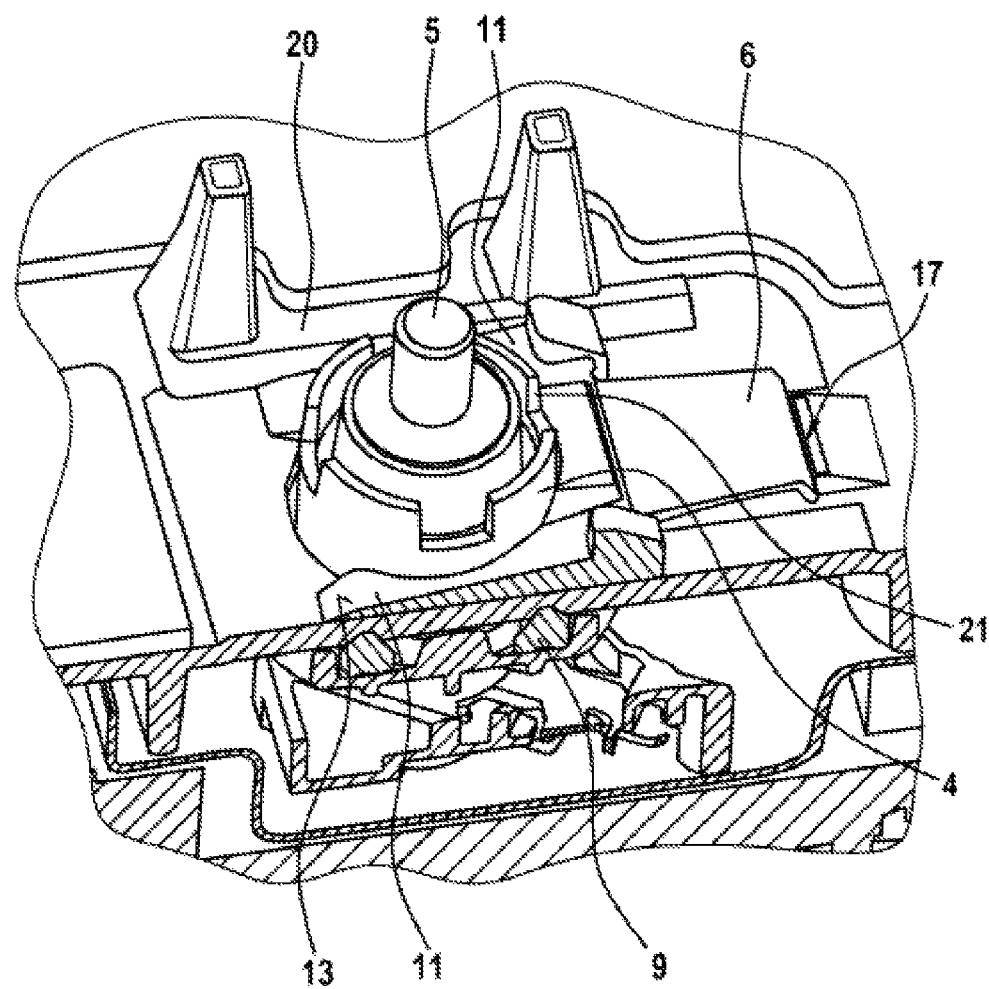
FIG. 5 shows a second sectional view of the electrical contact arrangement according to the invention according to the exemplary embodiment.

FIGS. 4 and 5 show that the fastening element 6, in particular the two fingers 11, rest with their outer edges against shoulders 20 of the housing 2. On account of this form fit with respect to the shoulders 20, rotation of the fastening element 6 about the axial direction 7 is avoided. As a result, the bushing 4, together with the contact pin 5, is at the same time received in a rotation-proof manner. The outer end of the contact pin 5 advantageously has a thread 15. When a nut is screwed onto this thread 15, torque that arises is thus supported via the shoulders 20 with respect to the housing 2.

FIG. 5 shows an advantageous latching connection 17 between the fastening element 6 and the housing 2. To this end, the housing 2 has a corresponding catch or edge, behind which the fastening element 6 latches in place.

That end of the bushing 4 that protrudes out of the housing 2 is advantageously configured as a crown in the exemplary embodiment. This crown has openings 21. A pole shoe is advantageously fastened to the contact pin 5. This pole shoe is usually surrounded by a housing or cover. This cover or this housing can sit in the openings 21 in a form-fitting manner and thus in a rotation-proof manner and in a precise position.

The invention claimed is:

1. An electrical contact arrangement (1) comprising
   a housing (2) having a cutout (3) that penetrates the housing (2) in an axial direction (7),
   a bushing (4) inserted into the cutout (3), said bushing (4) having an axial sealing surface (8) in an interior of the housing (2) and
   having two ledges (10) extending perpendicularly to the axial direction (7) outside the housing (2),
   a contact pin (5) which is arranged fixedly in the bushing (4) and projects through the bushing (4),
   a fastening element (6) which is configured to rest on the housing (2) and to be introduced under the ledges (10), and
   wedge-shaped surfaces (13) between the bushing (4) and the fastening element (6) and/or between the housing (2) and the fastening element (6), such that, as a result of the fastening element (6) being introduced under the ledges (10), the sealing surface (8) is able to be drawn against the housing (2) from the inside.

2. The contact arrangement (1) as claimed in claim 1, characterized in that the fastening element (6) is configured in a fork-shaped manner by comprising two mutually connected, parallel fingers (11) for introduction under the ledges (10).

3. The contact arrangement (1) as claimed in claim 2, characterized in that the wedge-shaped surfaces (13) are formed on the fingers (11) and on the ledges (10).

4. The contact arrangement (1) as claimed in claim 1, characterized in that the contact pin (5) is arranged in the bushing (4) in a rotation-proof manner by way of a form fit.

5. The contact arrangement (1) as claimed in claim 1, characterized in that the bushing (4) is produced from plastics material and the contact pin (5) is encapsulated by the plastics material of the bushing (4).

6. The contact arrangement (1) as claimed in claim 1, characterized in that the fastening element (6) rests on the housing (2) in a rotation-proof manner by way of a form fit.

7. The contact arrangement (1) as claimed in claim 1, characterized in that an inclination of the wedge-shaped surfaces (13) provides a self-locking hold of the fastening element (6).

8. The contact arrangement (1) as claimed in claim 1, characterized by further comprising a latching connection (17) between the fastening element (6) and the housing (2) for fixing the introduced fastening element (6).

9. The contact arrangement (1) as claimed in claim 1, characterized in that an annular seal (9) is arranged on the sealing surface (8).

10. An arrangement for a vehicle, comprising at least one electrical contact arrangement (1) as claimed in claim 1, wherein a control unit, power electronics, an energy store and/or an electric machine is/are arranged in the housing (2).

11. The contact arrangement (1) as claimed in claim 1, wherein the ledges (10) extend perpendicularly to the axial direction (7) in grooves outside the housing (2).

12. The contact arrangement (1) as claimed in claim 11, characterized in that the fastening element (6) is configured in a fork-shaped manner by comprising two mutually connected, parallel fingers (11) for introduction under the ledges (10).

13. The contact arrangement (1) as claimed in claim 12, characterized in that the wedge-shaped surfaces (13) are formed on the fingers (11) and on the ledges (10) in the grooves.

\* \* \* \* \*